(12) United States Patent
Rabii

(10) Patent No.: US 6,215,335 B1
(45) Date of Patent: Apr. 10, 2001

(54) NONOVERLAPPING PHASED, RESETTABLE, PEAK DETECTOR

(75) Inventor: Shahriar Rabii, Stanford, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/312,436

(22) Filed: May 14, 1999

(51) Int. Cl.$^7$ .................................................. H03K 5/24
(52) U.S. Cl. ............................................. 327/74; 327/58
(58) Field of Search .......................... 327/74, 75, 76, 327/77–79, 87, 88, 94–96, 239, 258, 259, 58, 59, 60

(56) References Cited

U.S. PATENT DOCUMENTS 4,698,523 * 10/1987 Gershon et al. ...................... 327/97
4,859,873 * 8/1989 O'Shaughnessy et al. ........... 327/74
5,210,527 * 5/1993 Smith et al. ........................... 327/76
5,331,210 7/1994 McCarroll ............................. 327/58

* cited by examiner

Primary Examiner—Tuan T. Lam
(74) Attorney, Agent, or Firm—Merchant & Gould P.C.

(57) ABSTRACT

A peak detector that compares an input signal to a first reference voltage to produce a maximum sample signal, and compares the input signal to a second reference voltage to produce a minimum sample signal, wherein the maximum and minimum sample signals produce a sampling of the current input signal thereto to produce a maximum output signal and a minimum output signal, respectively. The detector compares the previously retrieved input signal value with a current input signal value. The current input signal is used as the maximum output signal if it is greater than a previous maximum output signal and providing the current input signal as the minimum output signal if it is less than a previous minimum output signal. The output provides signal level and offset signal information which, when gated with a predetermined clock signal, produces nonoverlapping phased output signals.

33 Claims, 6 Drawing Sheets

NONOVERLAPPING PHASED, RESETTABLE, PEAK DETECTOR

BACKGROUND OF THE INVENTION

1. Field of the Invention

This invention relates in general to a peak detector, and more particularly to a resettable peak detector that generates a nonoverlapping phased output signals.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, comparators, demodulators, filters, amplifiers and voltage regulators.

One important aspect of digital radio personal communications devices is the integration of the RF sections of transceivers. Compared to other types of integrated circuits, the level of integration in the RF sections of transceivers is still relatively low. Considerations of power dissipation, low offset budgets, form factor, and cost dictate that the RF/IF portions of these devices evolve to higher levels of integration than is true at present. Nevertheless, there are some key barriers to realizing these higher levels of integration.

For example, there are many applications where it's necessary to provide an RF peak detector circuit in an RF receiver system to determine level and offset signal values. These values are used as the inputs in subsequent circuits. For peak detectors, nonoverlapping phased output signals and resettability are required to provide the proper signaling to subsequent circuitry. In some components, such as a demodulator, the bit error rates (BER) start to degrade for signal levels above and below predetermined levels. This is due to offsets within such components. As a result, resettable circuitry and reliable level and offset information is necessary to provide signals within a predetermined range and to eliminate transient voltages.

It can be seen then that there is a need for an peak detector to provide level and offset signaling. Specifically, a peak detector that is resettable and provides a nonoverlapping phased output to eliminate transient voltages.

SUMMARY OF THE INVENTION

To overcome the limitations in the prior art described above, and to overcome other limitations that will become apparent upon reading and understanding the present specification, the present invention discloses a peak detector, and more particularly to a resettable peak detector that generates a nonoverlapping phase output signals.

The present invention solves the above-described problems by providing a peak detector that is resettable and generates a nonoverlapping phased output signal that provides a level and an offset signal value used in subsequent circuitry.

A method in accordance with the principles of the present invention includes comparing an input signal to a first reference signal to produce a maximum sample signal when the input signal is greater than the first reference signal. Comparing the input signal to a second reference signal to produce a minimum sample signal when the input signal is less than the first reference signal. Further, sampling the input signal to activate a maximum sample signal when the input signal is greater than the first reference signal and to activate a minimum sample signal when the input signal is less than the second reference signal, thereto to produce a maximum output signal and a minimum output signal, respectively.

Other embodiments of a system in accordance with the principles of the invention may include alternative or optional additional aspects. One such aspect of the present invention includes retaining the input signal in a storage medium.

Another aspect of the present invention is that the storage medium further includes a sample and hold amplifier.

Another aspect of the present invention is that the input signal includes an in-phase and a quadrature input signal.

Another aspect of the present invention is that the input signal is stored as the first reference signal in a maximum sample and hold amplifier, when the input signal is greater than the first reference signal.

Another aspect of the present invention is that the input signal is stored as the second reference signal in a minimum sample and hold amplifier, when the input signal is less than the first reference signal.

Another aspect of the present invention is that the detector includes a reset signal.

Another aspect of the present invention is that the implementation of the reset signal further includes a maximum reference signal and a minimum reference signal.

Another aspect of the present invention is that the maximum reference signal and the minimum reference signal further includes a positive signal level for a maximum reference signal and a negative signal level for a minimum reference signal.

Another aspect of the present invention is that the implementation of the reset signal reduces transient signals in the maximum and the minimum output signals.

Another aspect of the present invention is that the maximum output signal and the minimum output signal provides a level and an offset signal.

Another aspect of the present invention is that the minimum and maximum sample signals are generated as a function of a comparator and a clock signal output.

Another aspect of the present invention is that the minimum and maximum sample signals provide a maximum nonoverlapping phased output signal and a minimum nonoverlapping phased output signal.

Another aspect of the present invention is that the clock signal further includes a voltage doubler that controls a sample and hold amplifier.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issues of a comparator circuit such as the peak detector is to generate a resettable nonoverlapping phased signal and to provide a level and offset signal value as input to subsequent circuitry. The peak detector is part of the automatic gain control (AGC) circuit in the in-phase/quadrature path of a wireless receiver. The maximum and minimum input signals, $V_{max}$ and $V_{min}$ respectively, are a positive and a negative peak value of an in-phase or a quadrature signal, also referred to as a differential signal. The input signals are generated by an RF receiver signal. Thus, the output of the peak detector is used to calculate the in-phase and the quadrature signal level by $V_{p-p}=V_{max}-V_{min}$. Also, the output of the peak detector is used to calculate the in-phase and the quadrature offset voltage level by $V_{offset}=(V_{max}+V_{min})/2$. The peak detector compares an input signal to a first reference voltage to produce a maximum sample signal, and compares the input signal to a second reference voltage to produce a minimum sample signal, wherein the maximum and minimum sample signals produce a sampling of the current input signal thereto to produce a maximum output signal and a minimum output signal respectively.

In a time-divisional duplex transceiver system, the transmitter and receiver are never on simultaneously. In operation, data is bursted by the RF transmitter at more than twice the rate of the continuous input data to be transmitted for less than half the time. The far end receiver stores up the bursted data to be read out of a memory at a slower continuous pace. The receiver circuits, however, typically introduce DC offset voltages. The peak detector senses the in-phase and quadrature input signals to determine these offset voltages and signal levels. The peak detector output provides the level and offset information to drive the digital logic circuits that ultimately serve to acquire the desired gain and attenuate offsets in a system.

Figure 1:
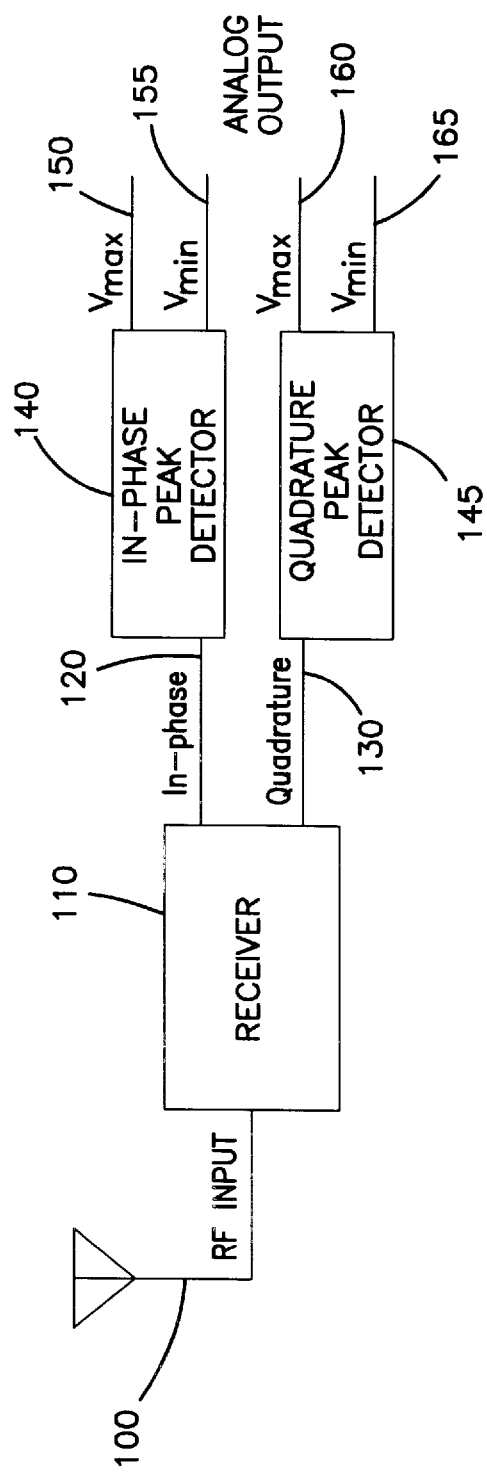
FIG. 1 is an exemplary diagram showing a peak detector in a typical radio receiver system.

FIG. 1 is an exemplary diagram showing the peak detector in a typical radio receiver system. An RF signal is received by an antenna 100 and is routed into receiver system 110. The outputs from the receiver system, the in-phase 120 and the quadrature 130 signals, are the input signals to the in-phase 140 and the quadrature 145 peak detectors. The peak detector output signals are comprised of a maximum ($V_{max}$) 150 and a minimum ($V_{min}$) 155 in-phase output signal and a maximum ($V_{max}$) 160 and a minimum ($V_{min}$) 165 quadrature output signal. The generated outputs are capable of providing level and offset information.

Figure 2:
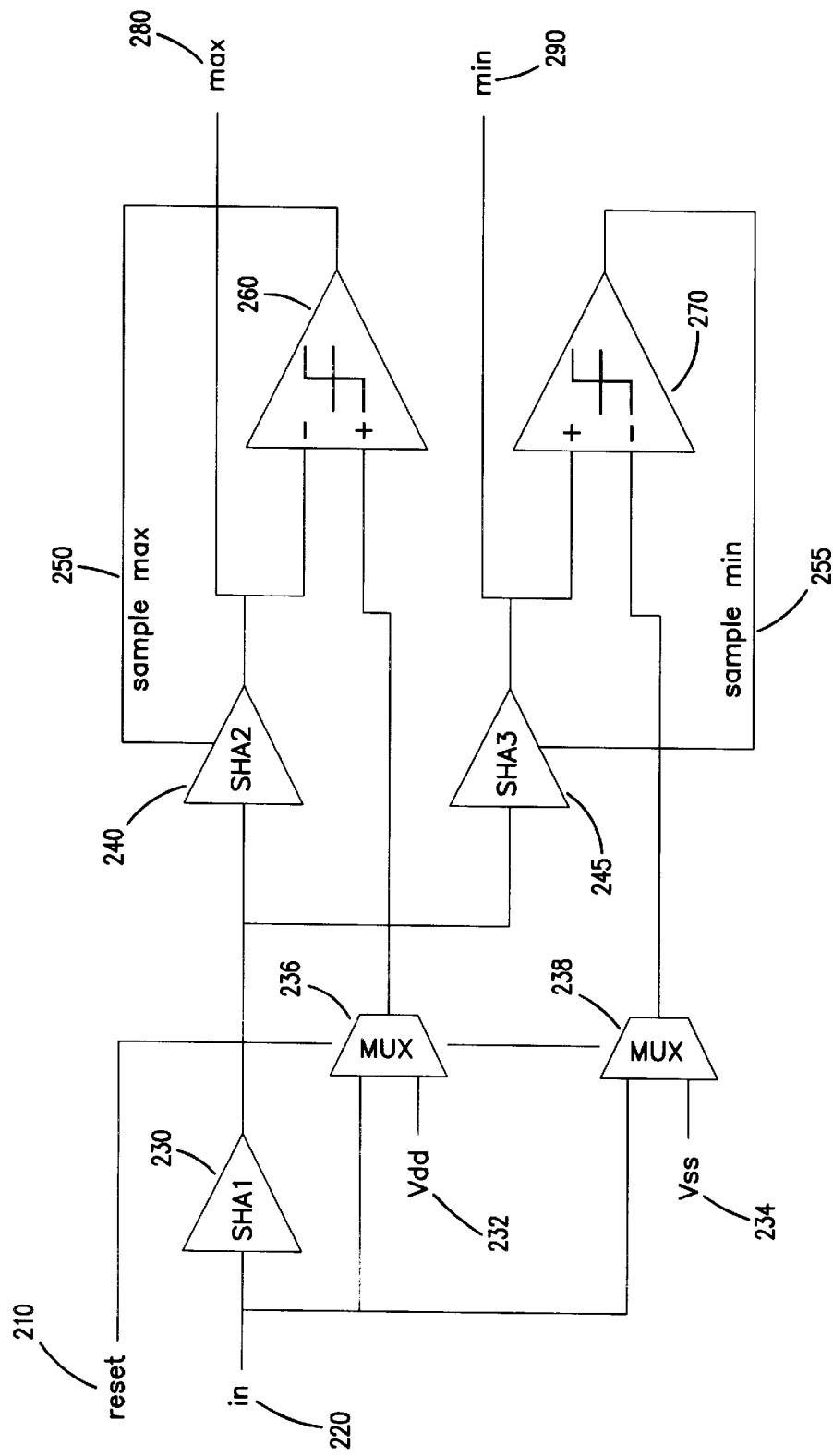
FIG. 2 is a block diagram of a peak detector circuit.

FIG. 2 is block diagram of a peak detector circuit. The peak detector circuit monitors a stream of input voltages 220 and generates outputs equal to the maximum signal 280 and minimum signal 290 values. In its normal operation mode, the maximum comparator 260 compares the input signal with the maximum signal stored in maximum sample and hold amplifier (SHA2) 240. The minimum comparator 270 compares the input signal with the minimum value stored in minimum sample and hold amplifier (SHA3) 245. The sample and hold amplifier (SHA1) 230 samples and holds the current input value 220. If the input signal 220 is greater than the maximum signal stored in SHA2 240, the sample max signal 250 is active and the output of SHA1 230 is transferred to SHA2 to update the maximum sample and hold amplifier 240. If the input signal 220 is less than the minimum signal stored in SHA3 245, the sample min signal 255 is active and the output of SHA1 230 is transferred to SHA3 245 to update the minimum sample and hold amplifier 245.

When a reset 210 is activated, multiplexers 236, 238 are used to switch from the input signal to a positive (Vdd) 232 and a negative (Vss) 234 supply rail signal. The supply rail signals 232, 234 are used in the comparison 260, 270 with the maximum signal stored in SHA2 240 and the minimum signal stored in SHA3 245, respectively. The reset signal thus forces the outputs 280, 290 to be updated with the input signal 220. The comparators 260, 270 output is gated with the clock signal to generate the nonoverlapping phased signals required by the SHA2 240 and SHA3 245 sample and hold amplifiers. Thus, it is obvious to those skilled in the art that the implementation of the sample max 250 and sample min 255 control signals may be more elaborate than what is suggested in the figure.

Each of these control functions is, in fact, implemented by three signals that are generated as a function of the comparator outputs 260, 270 and the clock signals. Finally, the control signals are then driven by voltage doublers to control the sample and hold amplifiers.

The peak detectors are used to find the peaks of the in phase and quadrature channels. The two outputs 280, 290 of the peak detector are added and subtracted by subsequent blocks to generate and estimate of the offset and peak to peak signal levels, respectively.

Figure 3:
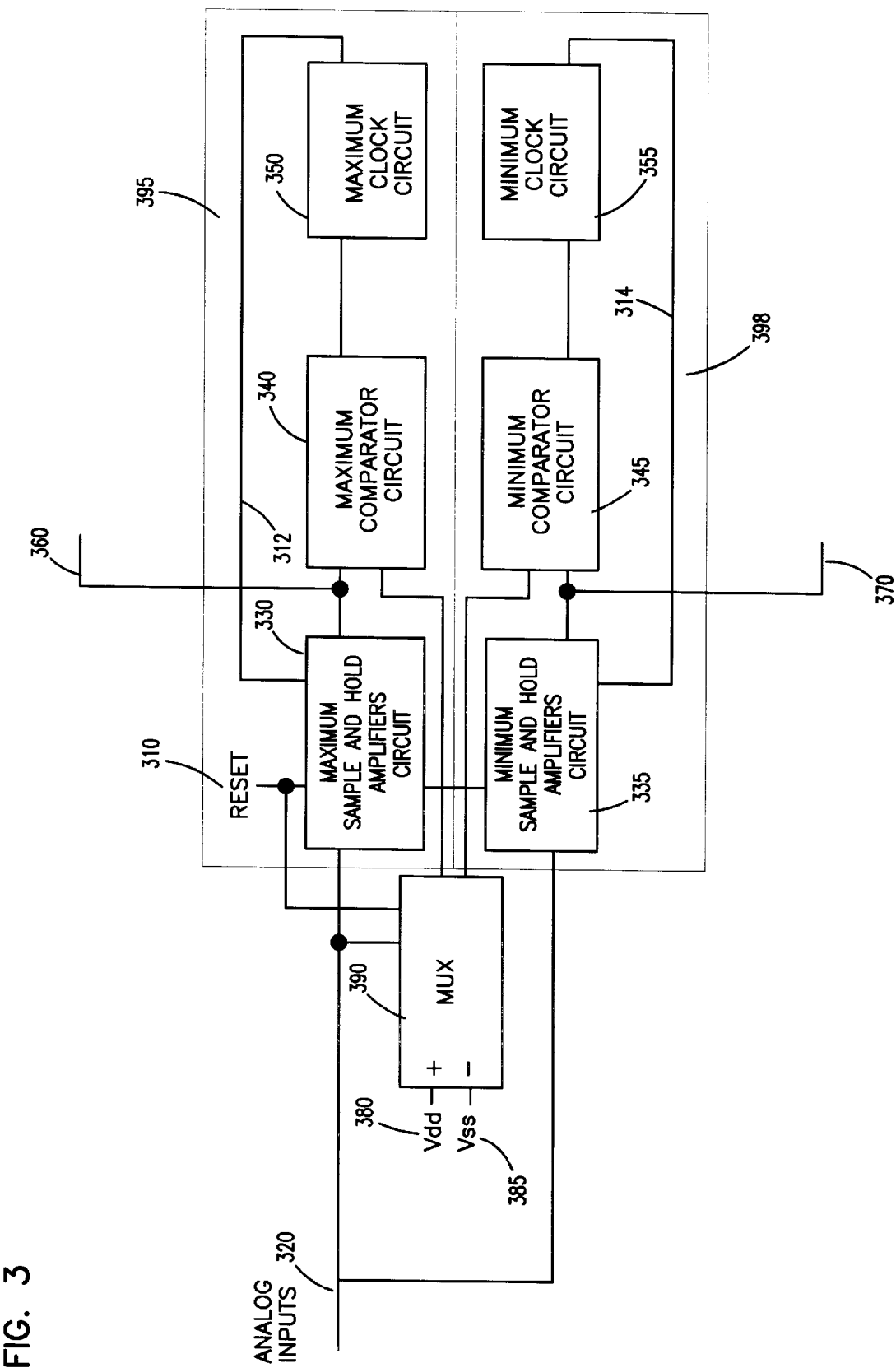
FIG. 3 is a block diagram of a peak detection network.

FIG. 3 is a block diagram of a peak detection network. The minimum and maximum sample and hold amplifiers 330, 335 determine if the input is greater than the previous maximum or less than the previous minimum, the appropriate sample signal 312, 314 becomes active and the output is updated. The amplified and offset corrected in-phase and quadrature signal 320 is then transmitted to the peak detector to be used in the determination of the offset voltage and signal level.

The minimum and maximum comparator circuits 340, 345 compare the input signal with the signal in the maximum sample and hold amplifiers 330 and the minimum sample and hold amplifiers 335. When the reset 310 signal is active, the multiplexor (MUX) 390 switches to allowing the supply rails signals 380, 385, instead of the input signal, to be compared with the previously held maximum and minimum signals in the sample and hold amplifiers 330, 335. This forces the outputs to be updated with the current input voltages.

The peak detector output, is combined with the minimum and maximum clock circuit signals 350, 355 and generates the nonoverlapping phased signal required by the sample and hold amplifiers 330, 335. Two peak detectors are used to find the peaks of the in-phase and the quadrature channels. The two outputs of the peak detectors 360, 370 are added and subtracted by subsequent blocks to generate an estimate of the offset and the peak to peak signal levels, respectively.

Figure 4:
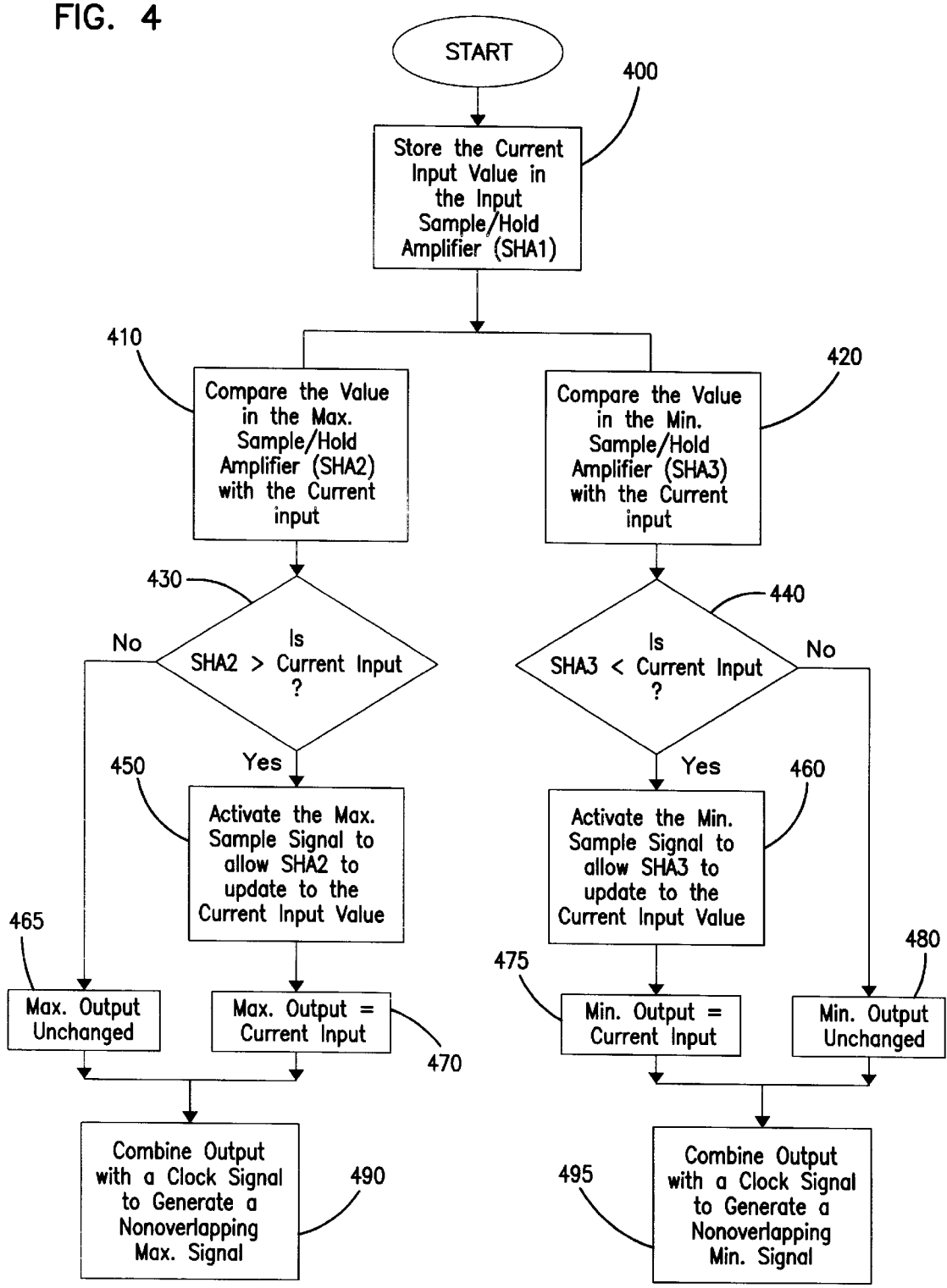
FIG. 4 is a flow diagram illustrating a general signal transition through the peak detector.

FIG. 4 is a flow diagram illustrating a general signal transition through the peak detector. The current input value is stored in the sample and hold amplifier (SHA1) 400. The current input value is compared with the value held in the maximum sample and hold amplifier (SHA2) 410. If the value held in the maximum sample and hold amplifier 410 is greater than the current input 430 the maximum sample signal 450 is activated to allow the maximum sample and hold amplifier to be update with the current input value. If the value in the maximum sample and hold amplifier 430 is less than the current input the output is unchanged 470. In either case the output is combined with a clock signal to generate a nonoverlapping maximum signal 490. Again, the current input value is stored in the sample and hold amplifier (SHA1) 400. The current input value is compared with the value held in the minimum sample and hold amplifier (SHA3) 420. If the value held in the minimum sample and hold amplifier 420 is less than the current input 440 the minimum sample signal 460 is activated to allow the minimum sample and hold amplifier to be updated with the current input value. If the value in the minimum sample and hold amplifier 440 is less than the current input, the output is unchanged 480. In either case an output is combined with the clock signal to generate a nonoverlapping minimum signal 495.

Figure 5:
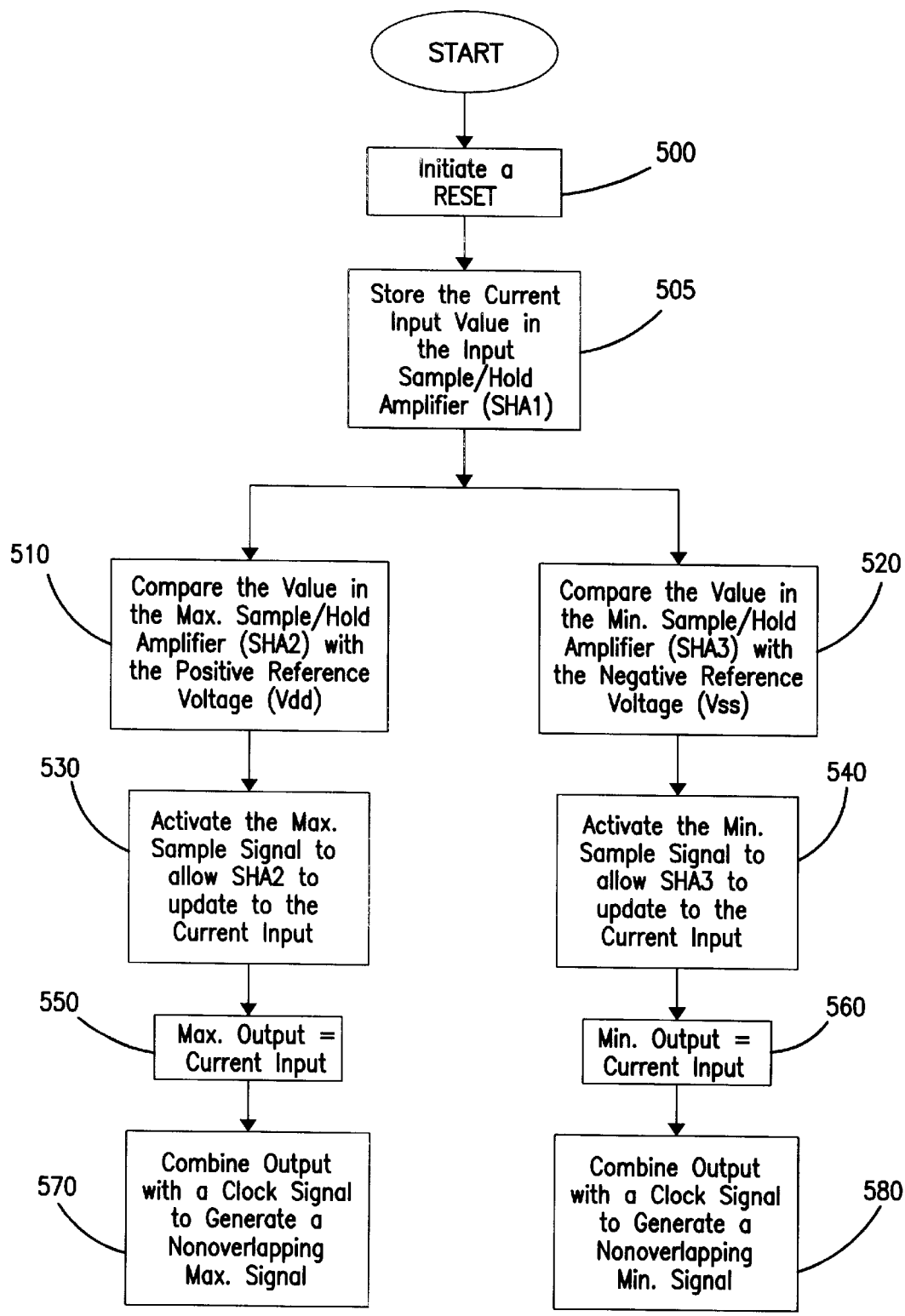
FIG. 5 is a flow diagram illustrating a reset signal transition through the peak detector.

FIG. 5 is a flow diagram illustrating the reset signal transition through the peak detector. When a reset signal is active 500, the current input value is stored in the input sample and hold amplifier (SHA1) 505. The activation of the reset allows the previously held maximum value in the maximum sample and hold amplifier (SHA2) to be compared 510 with the supply rail voltage thus triggering a maximum sample pulse regardless of the input voltage 530. The maximum output therefore is equal to the current input 550. The comparator output 570 is gated with a clock signal to generate a nonoverlapping phased signal required by the maximum sample and hold amplifier (SHA2). Again, when a reset signal is active 500, the current input value is stored in the input sample and hold amplifier (SHA1) 505. The activation of the reset allows the previously held minimum value in the minimum sample and hold amplifier (SHA3) to be compared 520 with the supply rail voltage thus triggering a minimum sample pulse regardless of the input voltage 540. The minimum signal output therefore is equal to the current input 560. The comparator output 580 is gated with the clock signal to generate the nonoverlapping phased signal required by the minimum sample and hold amplifier (SHA3).

Figure 6:
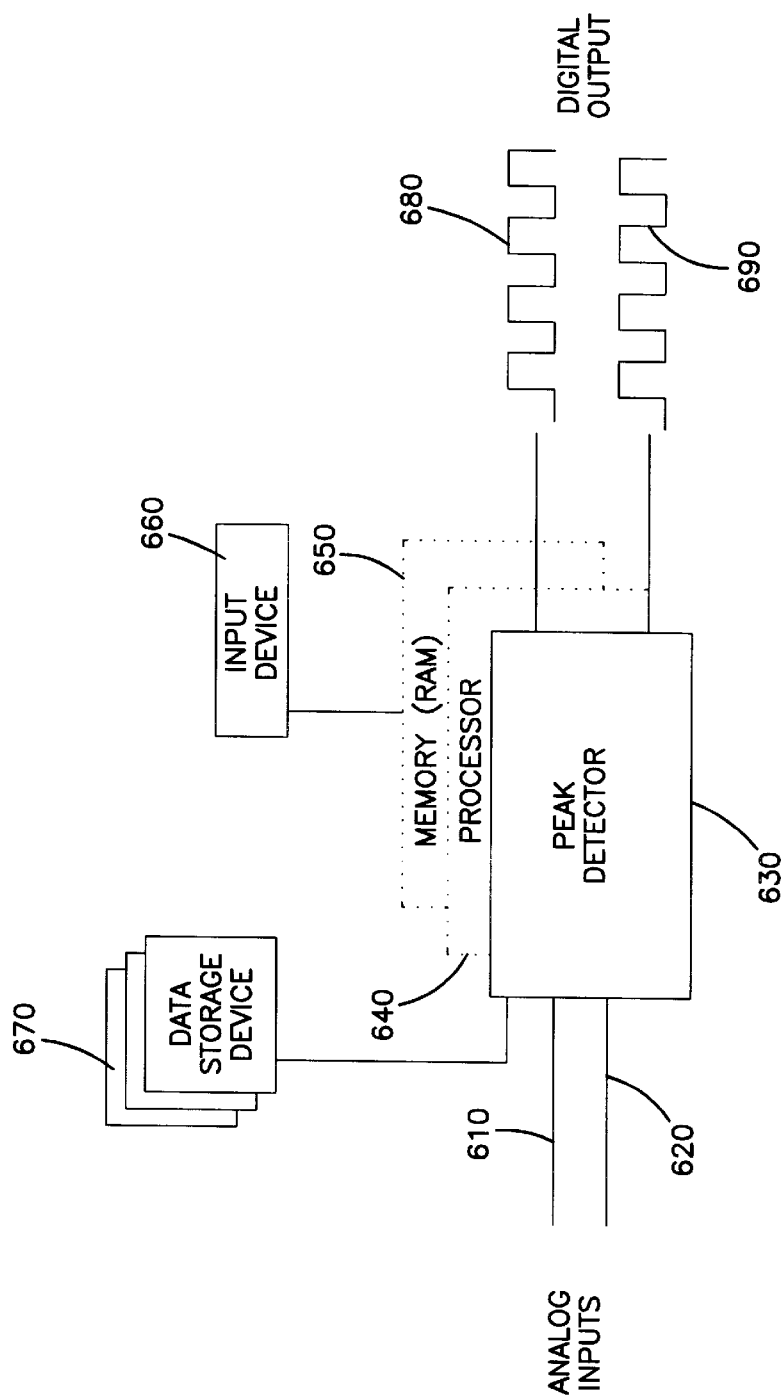
FIG. 6 is an exemplary hardware environment for the peak detector.

Referring to FIG. 6, another exemplary hardware environment for comparing multiple signals from a sources shown according to the present invention. The present invention may be implemented using an peak detector 630, comprised of a processor 640 and memory (RAM) 650. It is envisioned that attached to the detector 630 may be a memory device 650. Also included in this embodiment may be input devices 660, for downloading data and commands.

The detector 630 may operate under the control of an operating system. The detector 630 executes one or more computer programs under the control of the operating system.

Generally, the operating system and the detector programs may be tangibly embodied in a computer-readable medium or carrier, e.g. one or more of the fixed or removable data storage devices 670, or other data storage or data communications devices. Both operating system and the computer programs may be loaded from the data storage devices into the memory 650 of the detector 630 for execution by the processor 640. Those skilled in the art will recognize that the memory 650 is optional, or may be a memory device embedded or otherwise couple to the peak detector 630. Both the operating system and the detector programs comprise instructions which, when read and executed by the processor 640, cause the detector to perform the steps necessary to execute the steps or elements of the present invention.

Although one detector system configuration is illustrated in FIG. 6, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of detecting multiple signals from a source, comprising the steps of:

comparing an input signal to a first reference signal to produce a maximum sample signal when the input signal is greater than the first reference signal;

comparing the input signal to a second reference signal to produce a minimum sample signal when the input signal is less than the first reference signal; and sampling the input signal, the maximum sample signal being used to generate a maximum output signal when the input signal is greater than the first reference signal, and the minimum sample signal being used to generate a minimum output signal when the input signal is less than the second reference signal.

2. The method of claim 1, further comprising the step of holding the input signal in a storage medium.

3. The method of claim 2, wherein the step of holding the input signal in the storage medium includes a step of holding the input signal in a sample and hold amplifier.

4. The method of claim 2, wherein the step of sampling the input signal includes a step of sampling an in-phase and a quadrature signal.

5. The method of claim 3, further comprising a step of holding an output of the sample and hold amplifier at a maximum sample and hold amplifier when the input signal is not more than the first reference signal, an output of the maximum sample and hold amplifier being the first reference signal.

6. The method of claim 3, further comprising a step of holding an output of the sample and hold amplifier at a minimum sample and hold amplifier when the input signal is not less than the second reference signal, an output of the minimum sample and hold amplifier being the second reference signal.

7. The method of claim 1, further comprising a step of providing a maximum reference signal and a minimum reference signal.

8. The method of claim 7, wherein the step of providing the maximum reference signal and the minimum reference signal further includes a step of providing a positive signal level for the maximum reference signal and a negative signal level for the minimum reference signal.

9. The method of claim 1, further comprising a step of providing a reset signal to enable a maximum reference signal and a minimum reference signal to reduce transient signals in the maximum and the minimum output signals.

10. The method of claim 1, further comprising a step of providing a level and offset signal which is generated from the maximum output signal and the minimum output signal.

11. The method of claim 1, wherein the step of producing the minimum and maximum sample signals includes a step of providing the minimum and maximum sample signals as a function of a comparator and a clock signal output.

12. The method of claim 11, wherein the step of producing the minimum and maximum sample signals further comprises providing a maximum nonoverlapping phased output signal and a minimum nonoverlapping phased output signal.

13. A detector circuit for detecting multiple signals from a source, comprising:
   a first comparator circuit for comparing an input signal to a first reference signal to produce a maximum sample signal when the input signal is greater than the first reference signal;
   a second comparator circuit for comparing the input signal to a second reference signal to produce a minimum sample signal when the input signal is less than the first reference signal; and
   a sampling circuit for sampling the input signal, the maximum sample signal being used to generate a maximum output signal when the input signal is greater than the first reference signal, and the minimum sample signal being used to generate a minimum output signal when the input signal is less than the second reference signal.

14. The detector circuit of claim 13, further comprising a sample and hold amplifier circuit for holding the input signal.

15. The detector circuit of claim 14, wherein the first and the second comparator circuits further include a maximum sample and hold amplifier circuit and a minimum sample and hold amplifier circuit, the maximum sample and hold amplifier holds an output of the sample and hold amplifier when the input signal is not more than the first reference signal, an output of the maximum sample and hold amplifier being the first reference signal, the minimum sample and hold amplifier holds the output of the sample and hold amplifier when the input signal is not less than the second reference signal.

16. The detector circuit of claim 13, wherein the input signal includes an in-phase and a quadrature input signal.

17. The detector circuit of claim 13, further comprising a reset signal circuit, coupled to the first and second comparator circuits, for reducing transient signals in the maximum and minimum output signals.

18. The detector circuit of claim 17, wherein the reset signal circuit provides a predetermined reference signal for the maximum and minimum output signals.

19. The detector circuit of claim 18, wherein the predetermined reference signal further includes a positive signal level for a maximum predetermined reference signals and a negative signal level for a minimum predetermined reference signal.

20. The detector circuit of claim 13, wherein the maximum output signal and the minimum output signal provide a level and an offset signal.

21. The detector circuit of claim 13, wherein the first and the second comparator circuits includes a clock circuit to provide a predetermined clock signal to produce a maximum nonoverlapping phased output signal and a minimum nonoverlapping phased output signal.

22. The detector circuit of claim 21, wherein the predetermined clock signal includes three signals that are produced as a function of outputs of the maximum and minimum comparator circuits.

23. A system for detecting multiple signals from a source, comprising:
   an antenna to retrieve a propagated signal;
   a detector, coupled to the antenna, for receiving the retrieved signal and generating an input signal;
   a peak detector, coupled to the detector, for comparing the input signal with a reference voltage to generate an analog output in response thereto, wherein the peak detector further comprises:
      a first comparator circuit for comparing an input signal to a first reference signal to produce a maximum sample signal when the input signal is greater than the first reference signal;
      a second comparator circuit for comparing the input signal to a second reference signal to produce a minimum sample signal when the input signal is less than the first reference signal; and
      a sampling circuit for sampling the input signal, the maximum sample signal being used to generate a maximum output signal when the input signal is greater than the first reference signal, and the minimum sample signal being used to generate a minimum output signal when the input signal is less than the second reference signal.

24. The system of claim 23, further comprising a sample and hold amplifier circuit for holding the input signal.

25. The system of claim 24, wherein the first and the second comparator circuits further include a maximum sample and hold amplifier circuit and a minimum sample and hold amplifier circuit, the maximum sample and hold amplifier holds an output of the sample and hold amplifier when the input signal is not more than the first reference signal, an output of the maximum sample and hold amplifier being the first reference signal, the minimum sample and hold amplifier holds the output of the sample and hold amplifier when the input signal is not less than the second reference signal.

26. The system of claim 23, wherein the input signal includes an in-phase and a quadrature input signal.

27. The system of claim 23, further comprising a reset signal circuit, coupled to the first and second comparator circuits, for reducing transient signals in the maximum and minimum output signals.

28. The system of claim 27, wherein the reset signal circuit further provides a predetermined reference signal for the maximum and minimum output signals.

29. The system of claim 28, wherein the predetermined reference signal further includes a positive signal level for a maximum predetermined reference signals and a negative signal level for a minimum predetermined reference signal.

30. The system of claim 23, wherein the maximum output signal and the minimum output signal provide a level and an offset signal.

31. The system of claim 23, wherein the first and the second comparator circuits includes a clock circuit to provide a predetermined clock signal to produce a maximum nonoverlapping phased output signal and a minimum nonoverlapping phased output signal.

32. The system of claim 31, wherein the predetermined clock signal includes three signals that are produced as a function of outputs of the maximum and minimum comparator circuits.

33. An article of manufacture for a peak detector, the article of manufacture comprising a computer readable medium having instructions for causing a processor to detect multiple signals from a source comprising:
   comparing an input signal to a first reference signal to produce a maximum sample signal when the input signal is greater than the first reference signal;
   comparing the input signal to a second reference signal to produce a minimum sample signal when the input signal is less than the first reference signal; and sampling the input signal, the maximum sample signal being used to generate a maximum output signal when the input signal is greater than the first reference signal, and the minimum sample signal being used to generate a minimum output signal when the input signal is less than the second reference signal.

* * * * *